United States Patent [19]
Frankeny et al.

[11] Patent Number: 5,146,674
[45] Date of Patent: Sep. 15, 1992

[54] MANUFACTURING PROCESS OF A HIGH DENSITY SUBSTRATE DESIGN

[75] Inventors: Richard F. Frankeny; Karl Hermann, both of Austin; Ronald L. Imken, Round Rock; Joseph LaTorre, Austin, all of Tex.

[73] Assignee: International Business Machines Corporation, Armonk, N.Y.

[21] Appl. No.: 724,245

[22] Filed: Jul. 1, 1991

[51] Int. Cl.⁵ .............................................. H05K 3/36
[52] U.S. Cl. ....................................... 29/830; 29/847
[58] Field of Search ................. 29/829, 830, 832, 840, 29/842, 843, 846, 847; 174/68.5; 361/397, 395

[56] References Cited

U.S. PATENT DOCUMENTS

| | | | |
|---|---|---|---|
| 3,436,819 | 4/1969 | Lunine | 29/628 |
| 3,546,775 | 12/1970 | Lalmond et al. | 29/846 X |
| 3,606,677 | 9/1971 | Ryan | 29/625 |
| 3,795,047 | 3/1974 | Abolafia et al. | 29/625 |
| 3,890,177 | 6/1975 | Pfahnl et al. | 29/829 X |
| 4,074,342 | 2/1978 | Honn et al. | 361/411 |
| 4,191,789 | 3/1980 | Brown et al. | 427/97 |
| 4,285,780 | 8/1981 | Schachter | 29/830 X |
| 4,496,793 | 1/1985 | Hanson et al. | 174/68.5 |
| 4,617,730 | 10/1986 | Geldermans et al. | 29/843 |
| 4,622,058 | 11/1986 | Leary-Renick et al. | 29/847 X |
| 4,663,840 | 5/1987 | Ubbens et al. | 29/853 |
| 4,683,653 | 8/1987 | Iwasa | 29/830 |
| 4,685,033 | 8/1987 | Inoue | 29/829 X |
| 4,721,831 | 1/1988 | Vora | 29/829 X |
| 4,736,521 | 4/1988 | Dohya | 29/830 |
| 4,882,454 | 11/1989 | Peterson et al. | 174/68.5 |
| 4,908,940 | 3/1990 | Amano et al. | 29/852 |
| 4,954,458 | 9/1990 | Reid | 437/51 |
| 4,963,697 | 10/1990 | Peterson et al. | 29/846 X |
| 4,967,314 | 10/1990 | Higgins, III | 361/414 |
| 4,991,285 | 2/1991 | Shaheen et al. | 29/830 |

FOREIGN PATENT DOCUMENTS 1951778  8/1971  Fed. Rep. of Germany ........ 29/830
220380   9/1990  Japan ..................................... 29/829

OTHER PUBLICATIONS

K. Hermann, IBM Technical Disclosure Bulletin, Jan. 1969, Multilayer Laminates.
C. Lester et al., Fabrication . . . Lines, IBM Technical Disclosure Bulletin Mar. 1967.
IBM TDB "Multilayer Module", vol. 20, No. 12, May 1978, pp. 5172-5174.
Research Disclosure "Selective Connection of Circuit Elements in Multilayer Ceramic Structure", Oct. 89, No. 306.

Primary Examiner—Timothy V. Eley
Attorney, Agent, or Firm—Mark E. McBurney

[57] ABSTRACT

Substrate layers with individual bumps and cavities are provided which can be manufactured and tested in parallel and then joined into a multilayer substrate. The method of manufacturing these layers, as contemplated by the present invention, includes initially forming a plurality of vias in a layer of electrically conductive material. Next, a dielectric material, is placed adjacent the layer of conductive material. Holes which are coaxial with the vias are then formed in the dielectric material. Electrically conductive material is then deposited within the vias, thereby forming a conductive stud. Additional electrically conductive material is then deposited, on the side of the dielectric opposite the conductive material to form a signal layer, as well projections of electrically conductive material extending from the studs. A continuous layer of dielectric material is then placed adjacent the side of the substrate opposite the projections. A portion of this layer, adjacent the stud, is then removed, thereby exposing the stud and forming a cavity. The substrate layers can then be joined to form a multilayer substrate module.

17 Claims, 10 Drawing Sheets

MANUFACTURING PROCESS OF A HIGH DENSITY SUBSTRATE DESIGN

DESCRIPTION

Background of the Invention

1. Field of the Invention

The present invention relates generally to the manufacture of electronic circuit components. More particularly, a method is provided for fabricating a substrate having plural input/output (I/0) connection points which are configured in a bump and cavity arrangement.

2. Description of Related Art

Currently it is known to form plural imprinted depressions (concave surfaces) and corresponding bumps, or projections (convex surfaces) in a substrate by using a punch, die, or the like, as described by co-pending U.S. patent application Ser. No. 07/459,087, filed Dec. 29, 1989. hereby incorporated by reference, assigned to the assignee of the present invention and having a docket number of AT9-89-065. Accuracy of the impingement of the punch on the substrate is a problem with this technology, as well as problems with deformation of the material being punched.

U.S. Pat. No. 4,940,181 shows and describes an interconnection system wherein a substrate, including a plurality of cavities, receives a solder ball from an integrated circuit device, or chip.

Other conventional multilayer substrates use elevated portions in adjacent opposing registration with corresponding electrically conductive bonding pads (U.S. Pat. No. 4,754,316). Additionally, sequential building of a multilayer substrate is known in the art, as shown by U.S. Pat. No. 4,963,697 and 4,967,314. However, sequential fabrication by joining each layer to build the multilayer substrate exhibits alignment problems since, connecting holes, or vias must be accurately aligned prior to joining. Further, once the sequentially manufactured multilayer substrate is complete, rework is precluded, since individual layers cannot be removed and replaced. Thus, if a single substrate layer is faulty, the entire multilayer substrate must be discarded. Testing is also a problem with conventional sequential multilayer substrates, i.e. the individual layers cannot be tested since they are originally being created at the time of fabrication of the multilayer substrate.

Therefore, it would be advantageous to have a multilayer substrate wherein the individual layers can be fabricated separately tested separately and then joined together. Further, a method of manufacturing these layers that will provide accurate placement of the interconnections (cavities and bumps) would be an advantage. A self aligning feature which allows the individual layers to be easily disposed in proper registration with one another, would also be desirable.

SUMMARY OF THE INVENTION

In contrast to the prior art, the present invention provides a method of individually fabricating discrete layers which may be joined in a multilayer substrate. Broadly, individual bump and cavity layers are used which can be manufactured and tested in parallel and then joined into the multilayer substrate in a final assembly process. The method of manufacturing these layers, as contemplated by the present invention includes using standard printed wiring board processes and materials to produce extremely accurate features on the substrate. The design is based on the use of solid vias, for enhancing electrical performance and dissipating heat, and low thermal expansion metal planes which control and minimize problems associated with expansion rates of materials due to different coefficients of thermal expansion. The method of the present invention provides for, initially forming a plurality of clearance holes in a layer of electrically conductive material. Next, a dielectric material is added, which encompasses the layer of conductive material. Holes, or vias are then formed in the dielectric material, which are coaxial with the clearance holes. Electrically conductive material is deposited within the vias, thereby forming a conductive stud. Subsequently, a continuous layer of dielectric material is placed adjacent the deposited dielectric material. A portion of this layer, adjacent the stud, is then removed, thereby exposing the stud and forming a cavity. Finally, additional electrically conductive material is deposited, on a side of the stud opposite the cavity, to form a projection of electrically conductive material. These layers can then be joined to form a multilayer substrate module wherein the cavities can be used to receive the bump from an adjacent layer, or a solder ball from a chip to be attached thereto.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
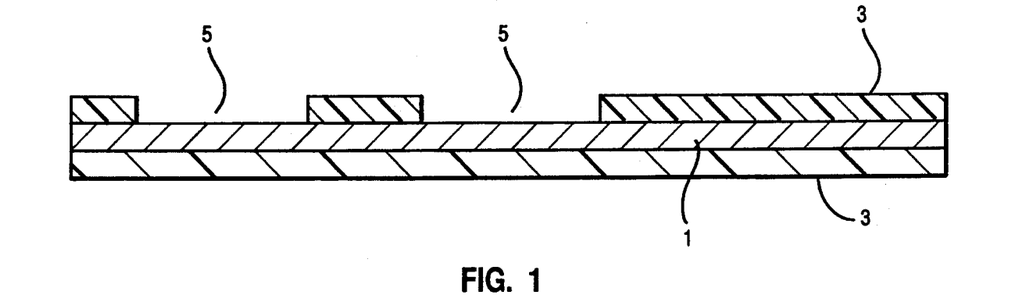
FIG. 1 is a crossectional view of a portion of metal foil which has been prepared for etching by having a photoresist applied to both sides.
Figure 2:
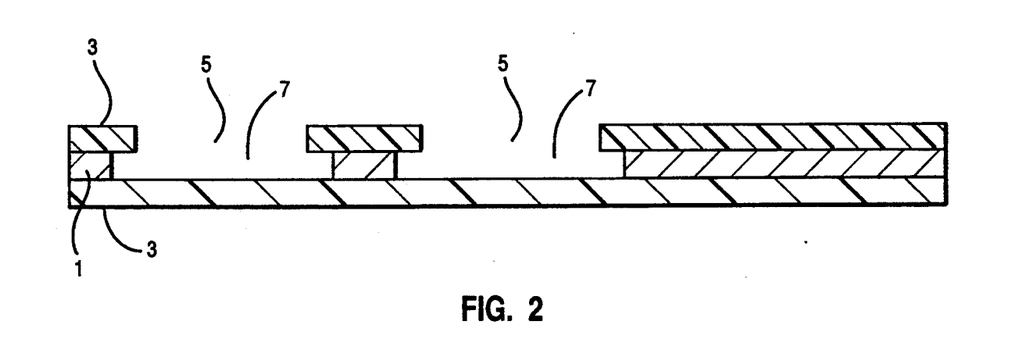
FIG. 2 is the foil of FIG. 1 after etching has occurred.

Referring to FIG. 1, a metal foil layer 1, such as copper-invar-copper (CIC), is prepared for etching by applying a photoresist 3 to both sides, exposing photoresist 3 to actinic energy through a mask, and then developing away the photoresist 3 on the top side of foil 1, to expose the metal foil through holes 5 in the resist. In FIG. 2, metal foil is etched through holes 5 of resist 3 to produce holes 7 having a diameter slightly larger than the diameter of holes 5. It will be understood by those skilled in the art that to produce clearance hole 7 of a predetermined diameter they must be etched through a hole 5 having a smaller diameter than the hole is actually desired. Thus, the size of the hole that 7 within foil 1 can be controlled by varying the diameter of hole 5 within photoresist material 3. Next, in FIG. 3, the photoresist material 3 is removed, or stripped from both sides of the metal foil 1 by conventional methods. Thus, metal foil 1, having clearance holes 7 therein, will remain and form the ground or reference plane layer of the substrate of the present invention.

Figure 3:
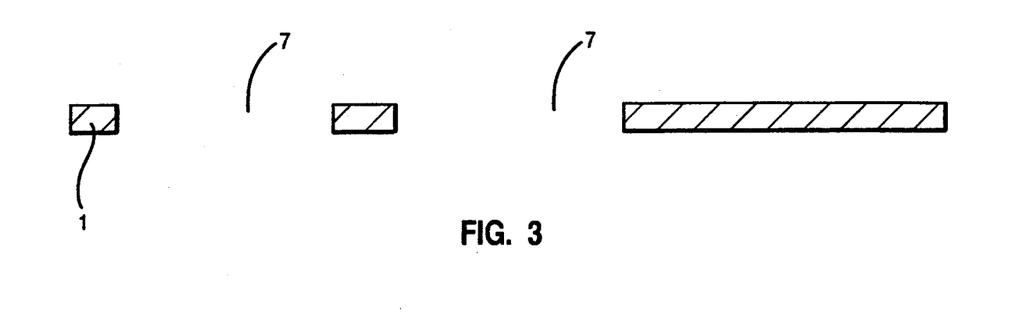
FIG. 3 is the metal with the photoresist removed.

The etched foil layer 1 (also referred to as groundplane 1 and reference plane 1) shown in FIG. 3 is then vacuum laminated (with heat and pressure) to a second foil layer 9 (FIG. 4) which has been precoated with a photoimageable dielectric 11. The lamination process causes the dielectric 11 to flow through and fill the holes 7 in etched foil layer 1. Excess dielectric 11 squeezes out from between the two foil sheets 1 and 9 such that a thin dielectric layer is disposed therebetween. It should be noted that the registration of metal foils 1 and 9 is not a critical parameter at this point in the process of the present invention. Although, not critical to the present invention, the photoimageable dielectric 11 can be applied to the metal foil 9 by conventional means such as curtain, slot, roller coating, or the like. After the lamination process of FIG. 4, the top side of the substrate assembly, now referred to generally by reference numeral 10 is coated with a second layer of the photoimageable dielectric material used in FIG. 4 and referred to by reference numeral 13 in FIG. 5. Again a number of conventional methods of applying layer 13 can be used such as curtain coating, spray coating or roller coating. This dielectric material 13 is used to electrically insulate the signal plane wiring (not shown) from the reference plane (metal foil 1).

Figure 4:
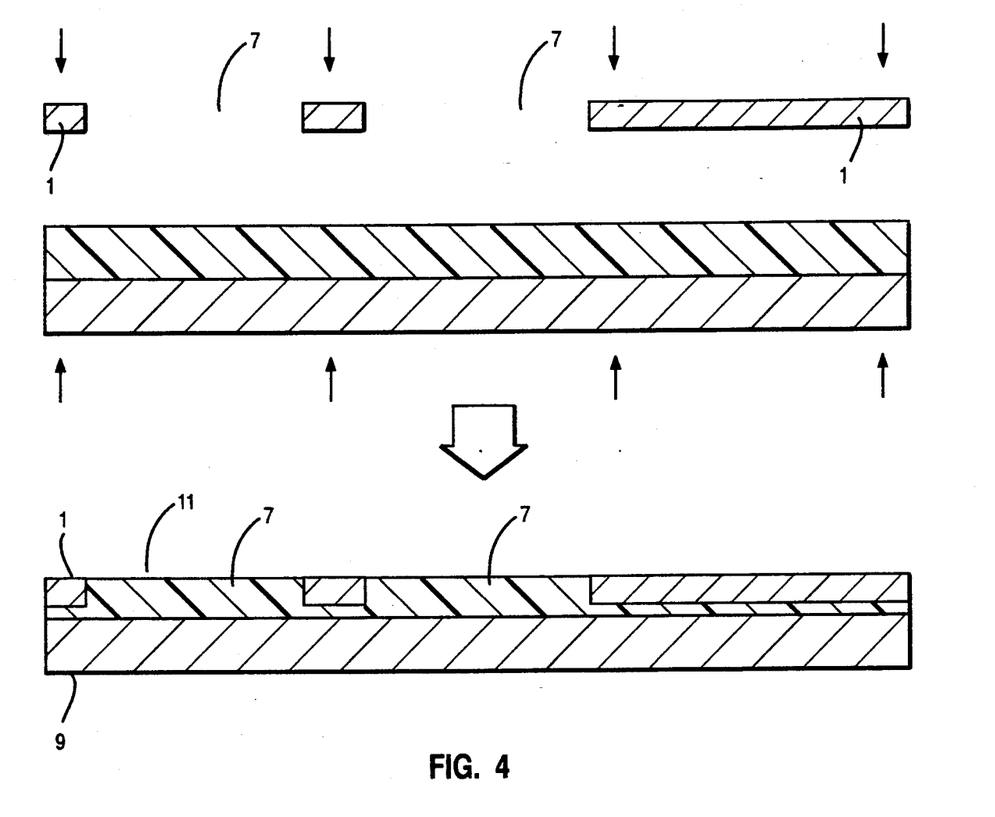
FIG. 4 is a crossection of the etched foil, laminated to a second metal carrier foil layer which has been pre-coated with a photoimageable dielectric material.
Figure 5:
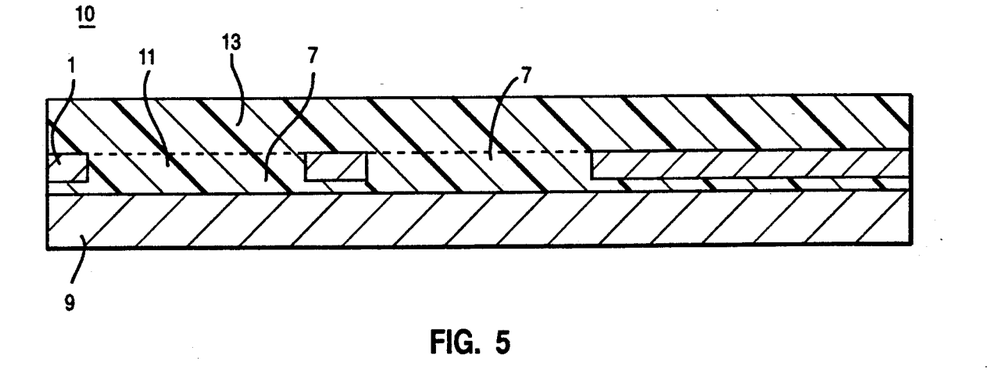
FIG. 5 shows a second layer of photoimageable dielectric material coated to the top of the laminated assembly of FIG. 4.
Figure 6:
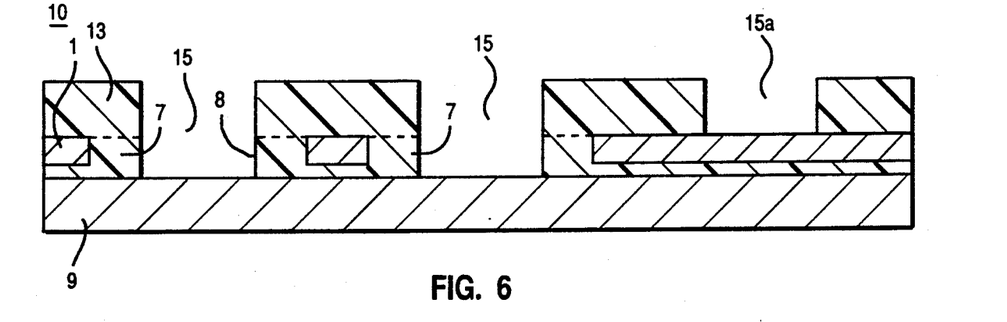
FIG. 6 illustrates the formation of vias after both layers of the photoimageable material have been exposed to radiation through a mask.

Referring to FIG. 6, the photoimageable dielectrical material of layers 11 and 13 are exposed to actinic radiation through a mask (also commonly referred to as artwork) and developed to remove unwanted dielectric that is coaxial to holes 7 in metal foil 1. Thus, since the dielectric material of layers 11 and 13, supplied in FIGS. 4 and 5 are exposed, holes 15 having a diameter less than that of holes 7, are produced within the hole 7 of foil 1. Therefore, an annular portion of dielectric 8 is left within hole 7. It can be seen from FIG. 6 that an additional hole 15a, which is not coincident with a hole 7 in foil 1 can be formed into substrate 10 in order to expose a portion of metal foil 1 which can be used to make a groundplane connection. It should be noted that the thickness of the dielectric material 13 may vary from approximately 0.5 to 2.0 mils of material, depending on the electrical characteristics required. By using appropriate artwork, holes 15 can be imaged and developed for both reference plane vias and isolated vias. In order to form isolated vias, holes 15 must expose a non-etched portion of carrier metal foil 9, whereas groundplane vias such as hole 15a, must expose metal foil 1, which subsequently becomes the reference plane of the substrate of the present invention.

Figure 7:
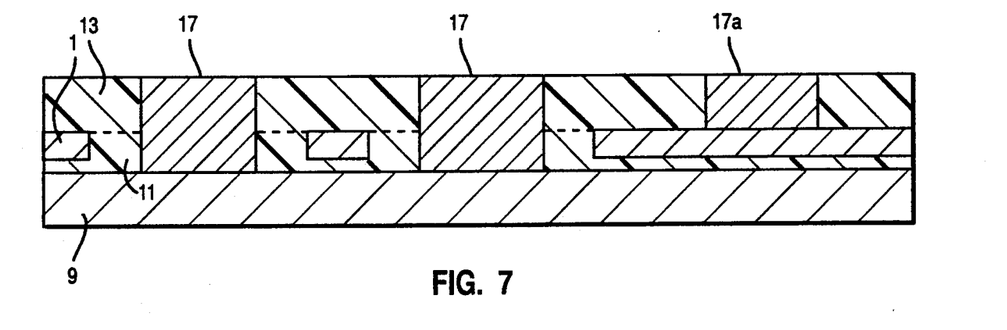
FIG. 7 shows copper plated into the vias and leveled, or planarized relative to the dielectric surface, thereby forming solid studs.

Next an electrical potential is applied between the laminated carrier assembly 10 and a copper anode (not shown), both being immersed in a suitable electrolyte solution such that copper is plated in the holes 15 and 15a, thereby forming solid studs 17 and 17a, respectively (which are also referred to herein as isolated vias and reference plane or groundplane vias, respectively), within the two layers of dielectrical material 13 and 11 (FIG. 7). It can be seen that copper studs 17 are in electrical contact with metal foil 9, but will be electrically isolated from metal foil 1 and form isolated vias 17, when foil 9 is subsequently removed. Conversely, metal stud 17a is in electrical contact with metal foil 1 and will subsequently form a groundplane, or reference plane via. It will be understood that the number of respective isolated and reference plane vias will be dependent on the configuration of the electronic component being fabricated. Also, it should be noted that the top surface of substrate 1 can be subjected to a planarization treatment such that the tops of the copper studs 17 and 17a are level with respect to the dielectrical material 13. This planarization treatment can include abrasive types, or a combination of abrasion type treatments and chemical etching in order to achieve faster metal removal. It should be noted that a dielectric layer (not shown) will be applied to the exposed surface of foil 9 (FIG. 7) during electroplating to prevent unwanted material from being deposited thereon.

Figure 8:
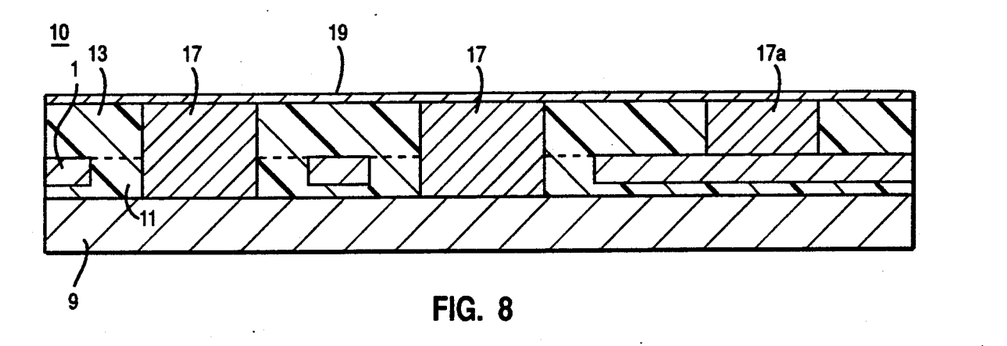
FIG. 8 includes a thin metal layer metallized onto the top of the assembly.

A thin electrically conductive layer, such as copper or a copper alloy (Cr/Cu, Ti/Cu, etc.) is then applied to the planarized surface of substrate 10, as shown in FIG. 8. Layer 19 will contact the top of studs 17 and 17a as well as dielectric layer 13. It should be noted that the originally applied dielectric layers 11 and 13 have been essentially combined into a single dielectric layer disposed between metal foil 9 and metallized layer 19, and encompassing metal foil 1. Hereinafter, dielectric layers 11 and 13 shall be referred to by the single reference numeral 21. It should also be noted that the top surface of layers 21 and studs 17 and 17a will be chemically or mechanically finished such that the surface is receptive to metal deposition and conducive to metal/dielectric adhesion. Layer 19 will function as a conductive base for the pattern plating of individual signal lines onto substrate 10, as well as plating of studs and electroplating cavities to be formed in subsequent steps of the process. Layer 19 can be applied by using electroless plating, sputter coating or the like.

Figure 9:
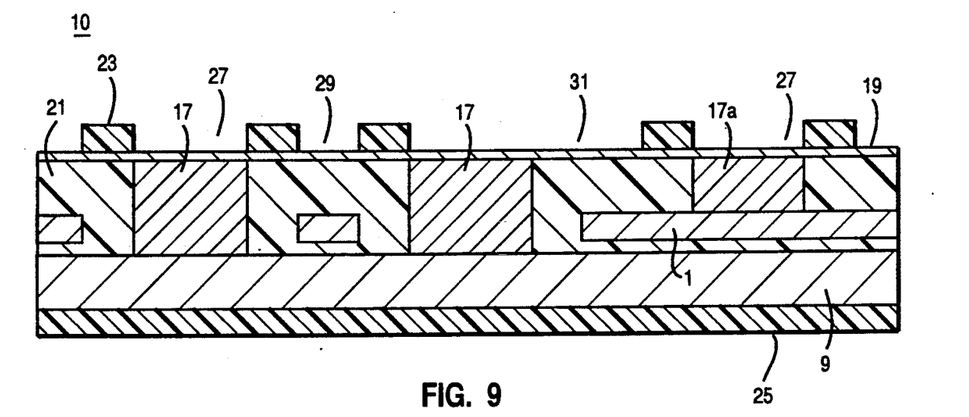
FIG. 9 is another crossection of the substrate being fabricated and shows a photoresist that has been applied to each side and developed so that openings are formed in the top side.
Figure 10:
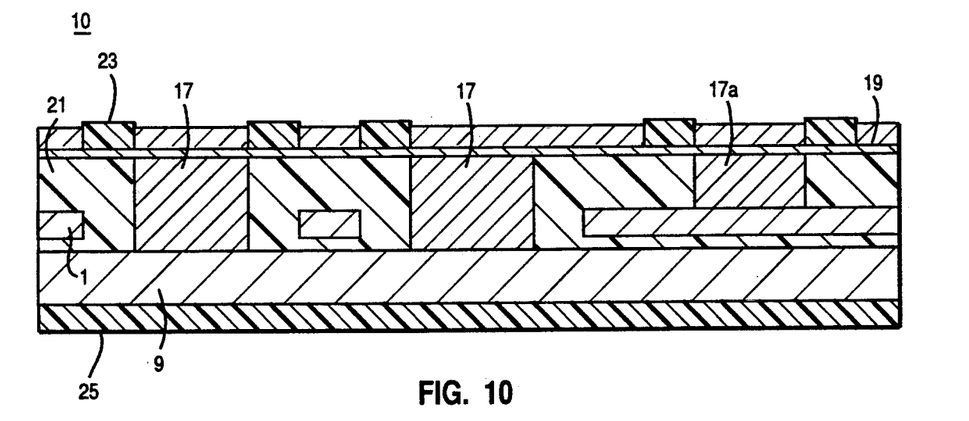
FIG. 10 shows copper that has been electroplated into the openings of FIG. 11.
Figure 11:
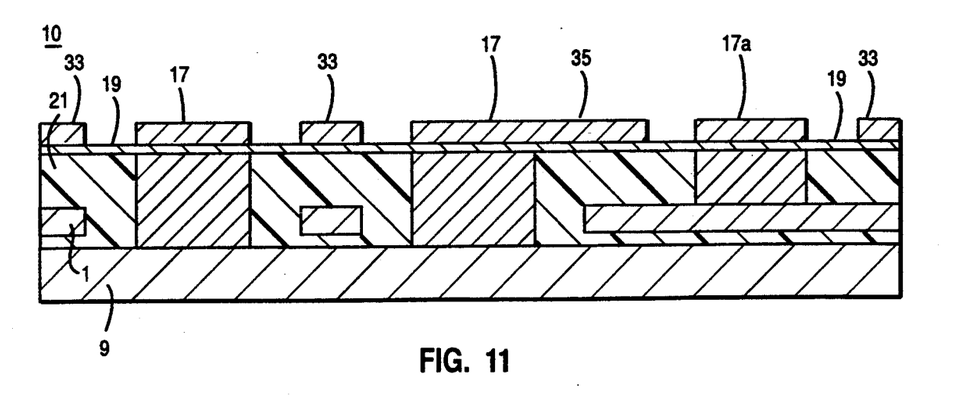
FIG. 11 is the substrate with the photoresist of FIG. 9 stripped away.

In FIG. 9, it can be seen that a thin layer (approximately 1 mil) of dielectric photoresist material 23, 25 is applied to each side of the substrate 10. Further, the layer 23 is exposed to actinic radiation through a mask, and developed such that openings are formed in the layer 23. These openings 27, 29 and 31 are utilized for various reasons, such as adding additional height to metal studs 17 and 17a, forming signal lines on the surface of substrate 10, and providing interconnection between signal lines on substrate 10 and metal studs 17. Layer 25 is applied to the bottom of substrate 10 in order to protect foil layer 9 and prevent unwanted eletroplating from occurring. Further, FIG. 10 shows the step wherein copper is electroplated into the openings 27, 29 and 31 of FIG. 9 to provide the various functions of increasing stud height, depositing signal lines, and the like as discussed above. More particularly, it can be seen that by electroplating copper within hole 27 of FIG. 9, the height of stud 17 can be increased by the thickness of layer 23. Other configurations may also be fabricated during this step. For example, copper could be plated to a thickness, less than the height of layer 23 to allow plating of other metals on top of the copper. By electroplating copper within hole 29 of FIG. 9, a signal line can be formed on the surface of substrate 10, which will be electrically isolated from groundplane 1 by dielectric 21, subsequent to removal of layer 19. An interconnection between stud 17 and a signal line can be implemented by the deposition of copper, or other conductive material into hole 31 of FIG. 9. The results of the process as depicted in FIGS. 9 and 10 can better be understood by reference to FIG. 11 which shows substrate 10 after the photoresist 23 and 25 has been chemically removed therefrom. FIG. 11 shows signal lines 33, that will be electrically isolated from groundplane 1 (after removal of layer 19) and disposed on the surface of substrate 10. Additionally, an interconnection line 35 is shown between studs 17 and a signal line on the surface of substrate 10 (not shown).

Figure 12:
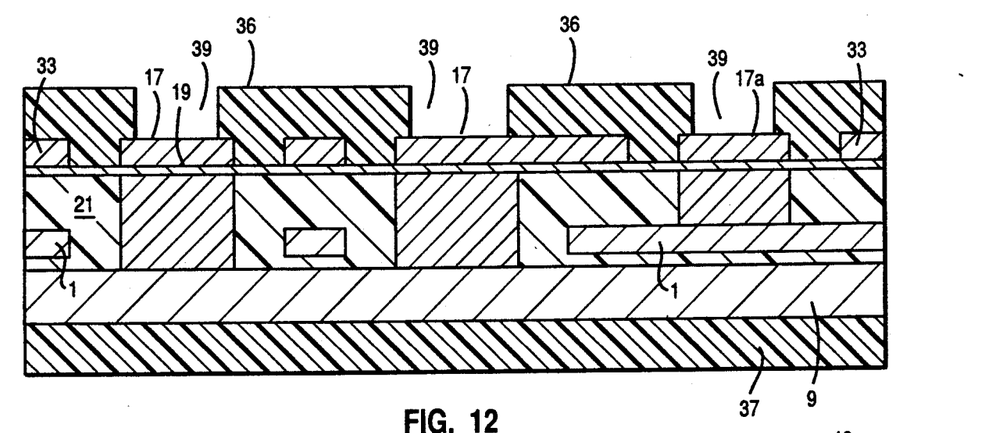
FIG. 12 shows photoresist that has been applied to the assembly and developed to create openings coincident with the studs.
Figure 13:
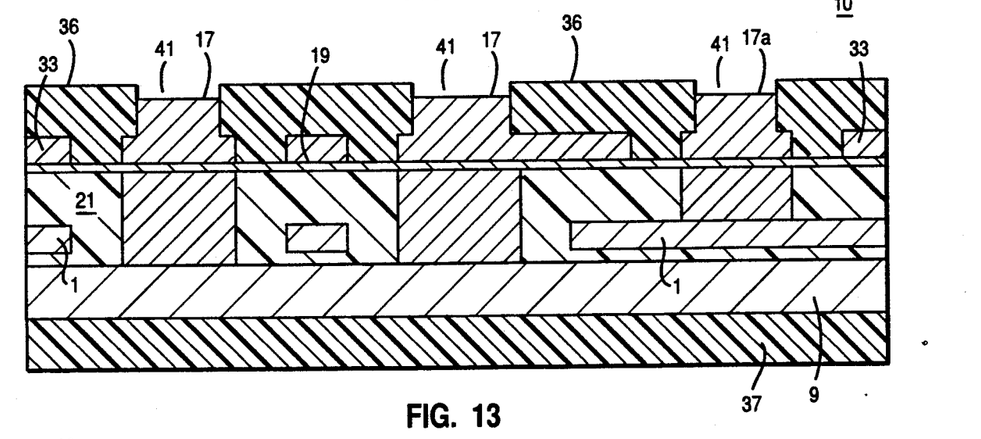
FIG. 13 illustrates additional copper that has been electroplated on the top side of the substrate assembly coincident with the studs.
Figure 14:
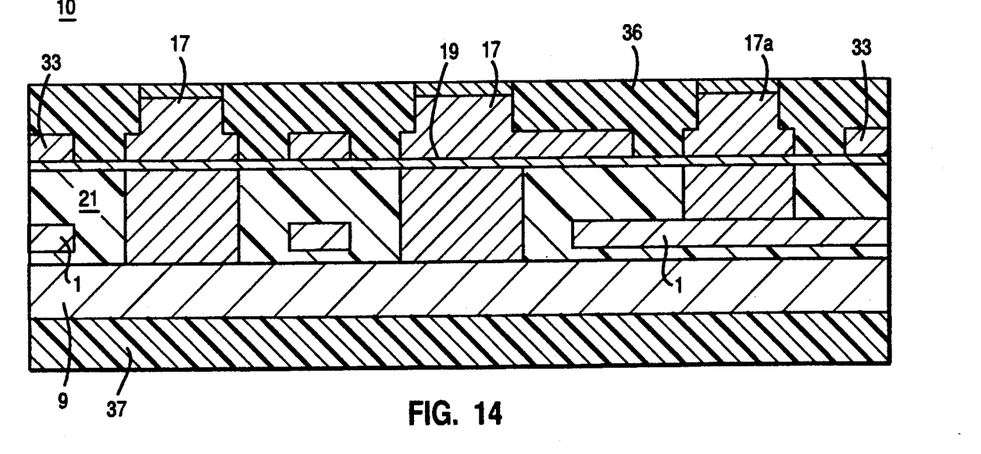
FIG. 14 shows joining metallurgy that has been electroplated to the top side of the stud and the cavity in the bottom of the substrate assembly.

FIG. 12 illustrates a means of further extending the height of stud 17 and 17a to form projections. Photoresist layers 36 and 37 are applied to each side of substrate 10 by hot roll lamination, or the like. Layers 36 and 37 may be approximately 2 mils thick, depending on the additional height needed for the projections, or bumps which will be added to studs 17, 17a. Next, a mask (not shown) is placed adjacent layer 36 such that material 36 is exposed to actinic radiation and developed to removed unwanted dielectric thereby creating holes 39 within layer 36. Next, copper is electroplated into holes 39 thereby extending the heights of studs 17 and 17a, as shown in FIG. 13. It should be noted that the top surface of stud 17 and 17a are not co-planar with top surface of dielectric layer 36 such that a hole 41 remains in layer 36. Holes 41 have the same diameter as holes 39 of FIG. 12 but may be shallower. It will be understood that photoresist layer 37 of FIGS. 12-14 is utilized in the same manner as layer 25 in FIGS. 9-10, i.e. to insulate metal foil 9 during the electroplating process. Therefore, unwanted copper will not be deposited on metal layer 9 during the electroplating processes occurring on the other side of substrate 10.

Figure 15:
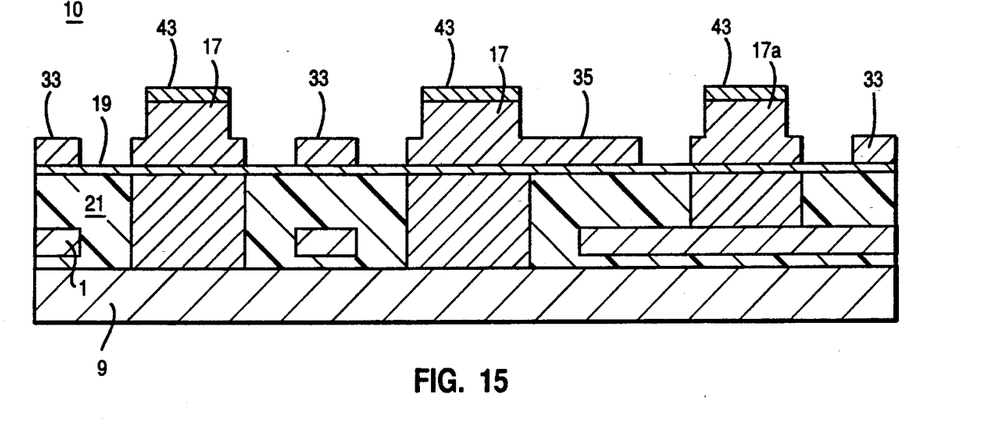
FIG. 15 shows the substrate after the photoresist material has been chemically stripped.

Shallow holes 41 of FIG. 13 are then filled by electroplating techniques in FIG. 14, with a suitable joining metallurgy material such as tin or tin/lead alloy with a thin nickel layer used as an underplate diffusion barrier between the copper of plane 1 and the tin/lead alloy. This allows substrate 10 to be joined with a similar substrate through a mechanically and electrically reliable interconnection joint. Subsequent to the deposition of the joining metallurgy onto studs 17 and 17a (into holes 41), the photoresist material 36 and 37 is removed from substrate 1 by chemical stripping, or the like. Referring to FIG. 15, studs 17 and 17a are shown with joining metallurgy material 43 disposed on the end thereof. Again signal lines 33 interconnection 35 and metallized layer 19 can be seen in FIG. 15, along with dielectric layer 21, groundplane 1 and carrier foil 9.

Figure 16:
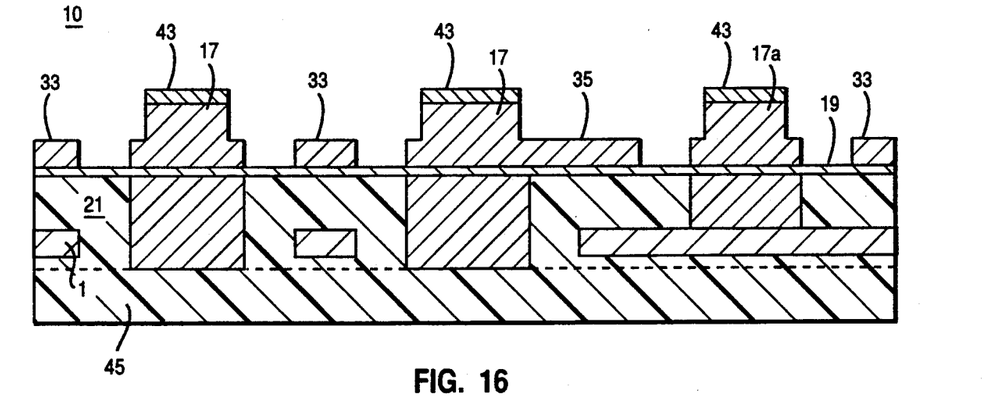
FIG. 16 represents the substrate after the copper carrier foil applied in conjunction with FIG. 4 has been etched away and a photoimageable dielectric material has been applied to the substrate bottom.
Figure 17:
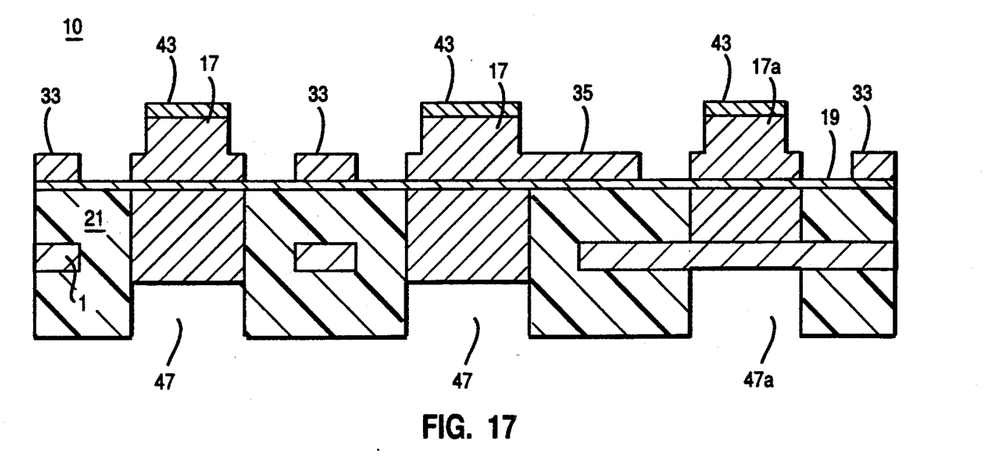
FIG. 17 shows the cavities formed in the dielectric material, applied in FIG. 16, after the photoimageable dielectric has been exposed to UV light through a mask, or laser ablated.
Figure 18:
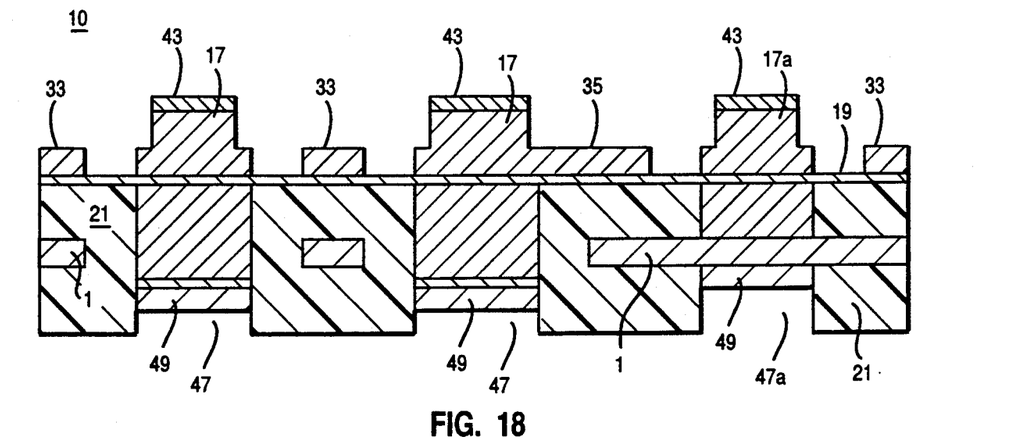
FIG. 18 shows a substrate wherein the joining metallurgy is placed in the cavities of FIG. 17.

Next, the process steps required to form cavities within substrate 10 will be described beginning with FIG. 16. Initially, carrier 9 is removed from substrate 10 by either peeling it away from the laminate or by chemically etching. An additional layer of photoimageable dielectric 45 is then applied to the bottom side of substrate 10. Again, it will be understood that new layer 45 will join with original dielectric layer 21, thereby forming a continuous photoimageable dielectric layer. Hereinafter, the combination of newly added layer 45 and original layer 21 will be referred to as photoimageable dielectrical layer 21. Referring to FIG. 17, the bottom of layer 21 is exposed to actinic radiation through a mask and developed to removed unwanted dielectric material. In this manner, cavities 47 and 47a are formed coincident and coaxial with studs 17 and 17a within dielectric layer 21. It can be seen that the depth of cavities 47, 47a is variable, based on the thickness of dielectric layer 45 applied to the bottom of substrate 10 in FIG. 16. Further the diameter of the cavities will be greater than the diameter of projections 17, 17a to facilitate layer to layer joining. This difference in dimensions of the bumps and cavities will help provide the self-aligning feature of the present invention. In FIG. 18, joining metallurgy 49 is then placed within cavities 47, 47a by electroplating, or the like. This joining metallurgy may be identical to the metallurgy 43 used in conjunction with studs 17 and 17a, such as a tin/lead alloy with a thin nickel layer, used as an underplate diffusion barrier between the copper of plane 1 and the tin/lead alloy.

Figure 19:
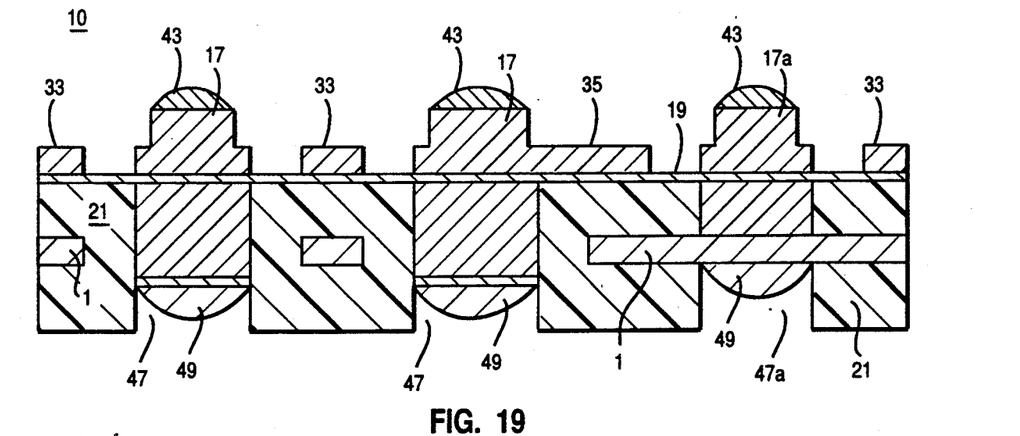
FIG. 19 shows a substrate wherein the joining metallurgy has been exposed to heat in order to reflow the metallurgy.
Figure 20:
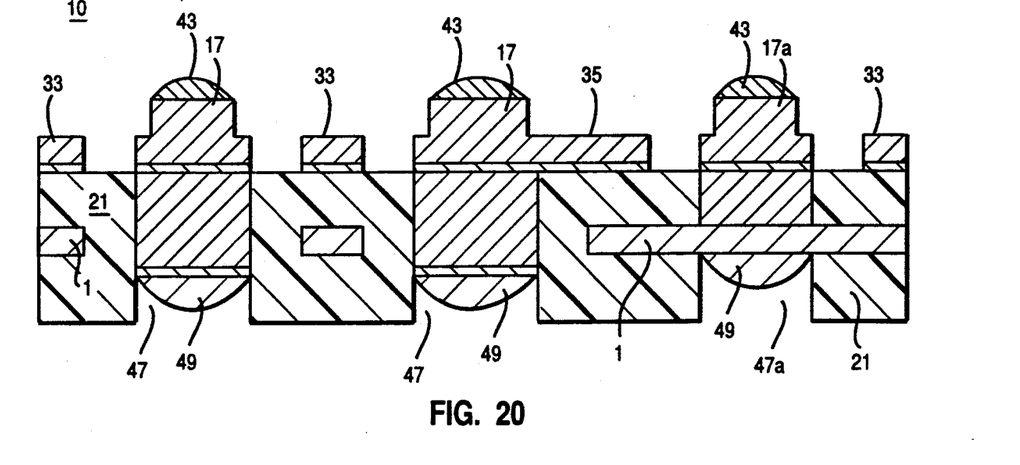
FIG. 20 shows the removal of the metallized layer, applied in FIG. 8, by flash etching.

Referring to FIG. 19, substrate 10 is shown after being exposed to heat in a reducing environment which will homogenize and reflow the alloy of the joining metallurgy, which results in dome shaped alloy deposited 43 and 49. This step of reflowing the joining metallurgy in order to homoginize the alloy and produce convex deposits will provide for better engagement of studs 17, 17a with cavities 47, 47a of adjacent layer during lamination therebetween. Additionally, by using dome shaped, joining metallurgy for the projection and cavity electrical interconnects, the present invention provides better engagement characteristics over imprinted bumps/cavities when multiple substrates 10 are joined together in a multilayer substrate. In FIG. 20, the exposed portion of metallized top layer 19, applied in FIG. 8, is removed by flash etching in order to isolate signal lines 33 from studs 17 and 17a. FIG. 20 shows a completed single substrate layer 10 of the present invention having interconnection points which are isolated from groundplane 1, as well as interconnection points which are electrically connected to the groundplane 1. More particularly, projection 17 and cavities 47 are electrically isolated from groundplane 1 by dielectric material 21. However, stud 17a and cavity 47a are in electrical connection with groundplane 1, thereby forming a groundplane via, whereas stud 17 and cavities 14 form isolated vias.

Figure 21:
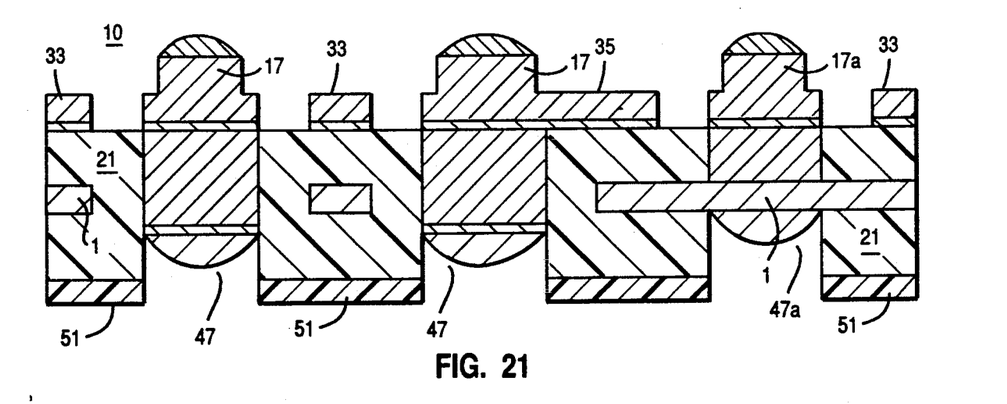
FIG. 21 illustrates the bottom of the substrate of the present invention coated with a joining dielectric material.

It will be understood by those skilled in the art that one reason for fabricating a substrate with projections and cavities included therein is to facilitate joining a single layer substrate to at least one other similarly configured substrate. As shown in FIG. 21, to form a multilayer substrate, a preferred embodiment may include applying a layer of joining dielectric material to the cavity side of substrate 10 with adhesive and/or sealing characteristics. Further, the joining material may be applied to the projection side of the substrate 10, or both the cavity and projection sides thereof. Copending U.S. patent application, Ser. No. 07/724,246 "Chip Attach and Sealing Method," assigned to the assignee of the present invention, hereby incorporated by reference, and filed concurrently herewith, describes a method of applying a thin layer of joining (adhesive/sealing) material to the surface of a substrate having a plurality of cavities therein. For example, offset printing techniques can be used to form a plurality of dots of the joining material on the substrate surface intermediate the cavities.

Figure 22:
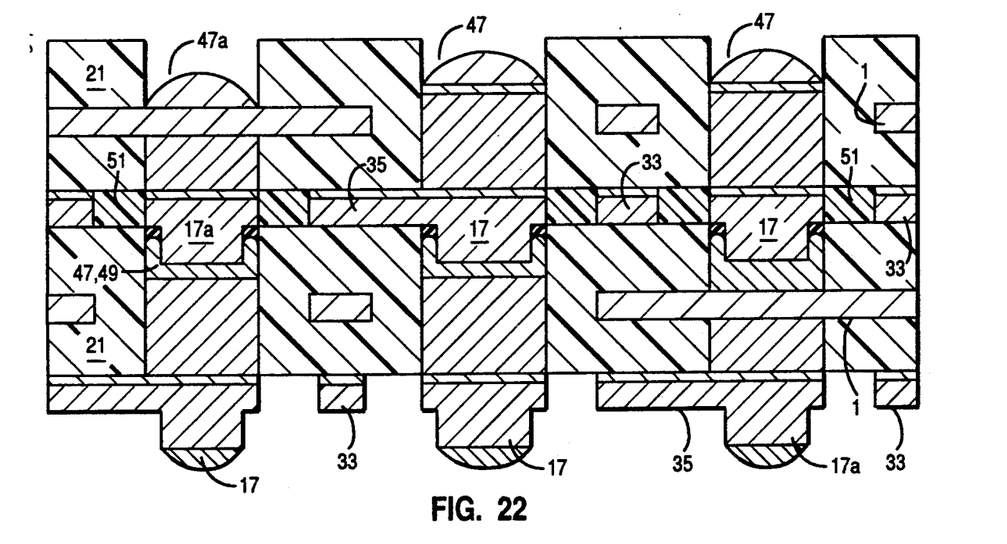
FIG. 22 shows two one signal/one groundplane 1S1P layers joined together to form a carrier as contemplated by the present invention.

FIG. 22 illustrates joining two 1S1P substrates together to form a multilayer structure. It can be seen that groundplane cavities 47a and studs 17a can be joined coaxially with isolated via cavities 47 and 17 or the like. Thus, the present invention is capable of fabricating an essentially unlimited number of differently configured 1S1P layers for joining together, to create a virtually unlimited number of different types of multilayer substrates. The two layers shown in FIG. 22 are joined to interconnect the vias from each of the individual substrates. The two layers are vacuum laminated in a pin-/parallel process. It should be noted that the thickness of the joining dielectric material of FIG. 21 should allow engagement of projections 17, 17a with cavities 47, 47a, respectively, prior to any outflow of dielectric joining material 51. Further, the temperature characteristic of the joining dielectric and joining metallurgy material should be such as to allow reflow of the joining metallurgy deposits to produce electrically connected vias, prior to the curing of the dielectric joining material 51. To build a multilayer substrate of the present invention, plural 1S1P substrates are fabricated and joining material is applied to the cavity side surface. The individual 1S1P substrates are then vertically aligned and stacked together, which includes compressing the substrates as well as laminating them, reflowing the joining metallurgy and allowing the joining material to cure.

Figure 23:
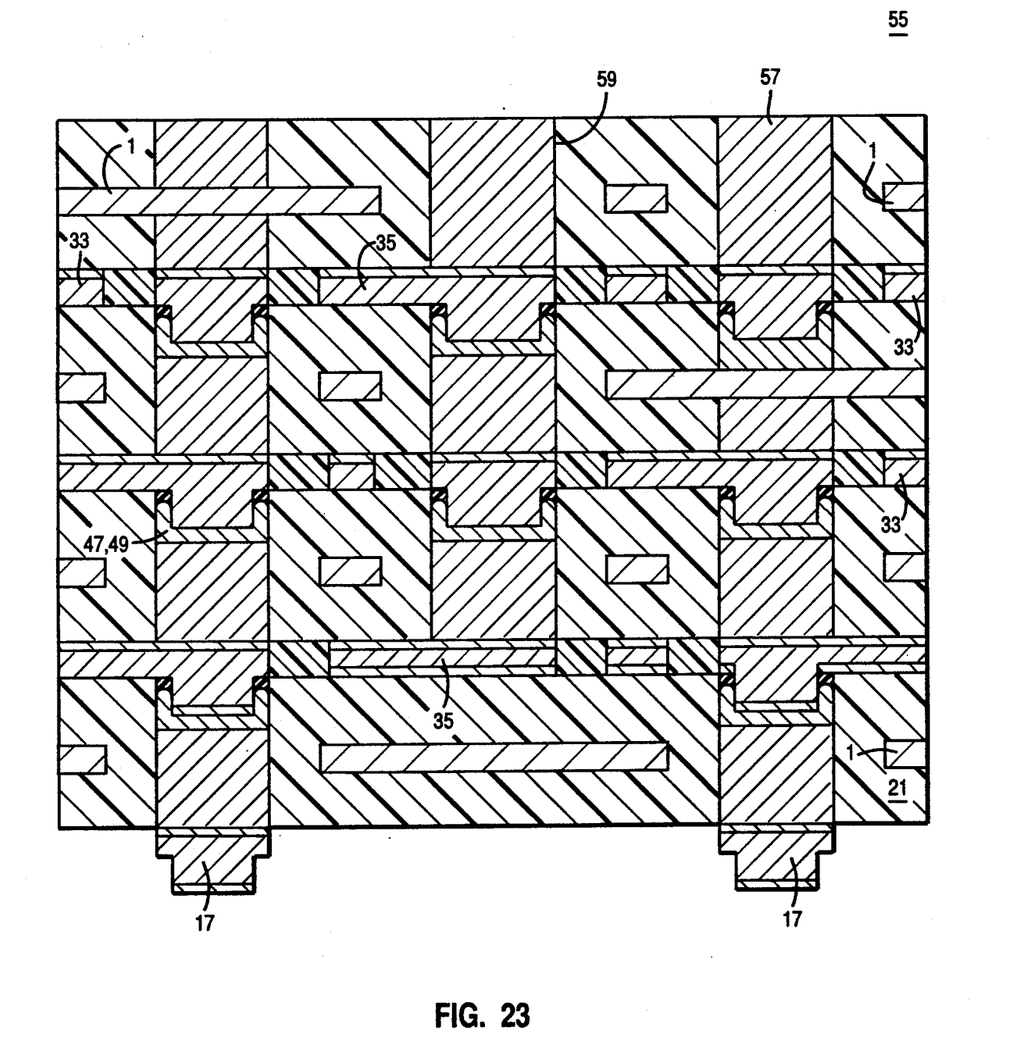
FIG. 23 is a multiple layer laminated carrier of the present invention.

FIG. 23 shows an example of a 4 signal, 4 groundplane structure (4S4P) produced by the laminating process of the present invention. Again, it can be seen that numerous variations of the process of the present invention can be utilized to create virtually unlimited configurations of multilayer substrate structures. For example, the top layer of multilayer substrate 55 illustrates how cavities can be eliminated in order to bring metallization to the top layer of the multilayer substrate. Electrically conductive material 57 is plated, or the like into cavities 47, 47a in order to bring metallization to the top of multilayer substrate 55. Further a blind via (via not continuous through the multilayer substrate) 59 can be fabricated which will allow interconnection with various signal lines on the individual layers to form multilayer substrate 55. In this manner, a larger crossection of electrically conductive material can be provided for specific signal lines, power lines, and the like, thereby providing enhanced power and noise reduction properties. It should be noted that fabricating an individual configuration merely requires altering one of the previously described process steps. For example, if a blind via is desired, then the appropriate art work should be used in conjunction with the structure of FIG. 12 such that the height of stud 17, 17a cannot be increased.

Figure 24:
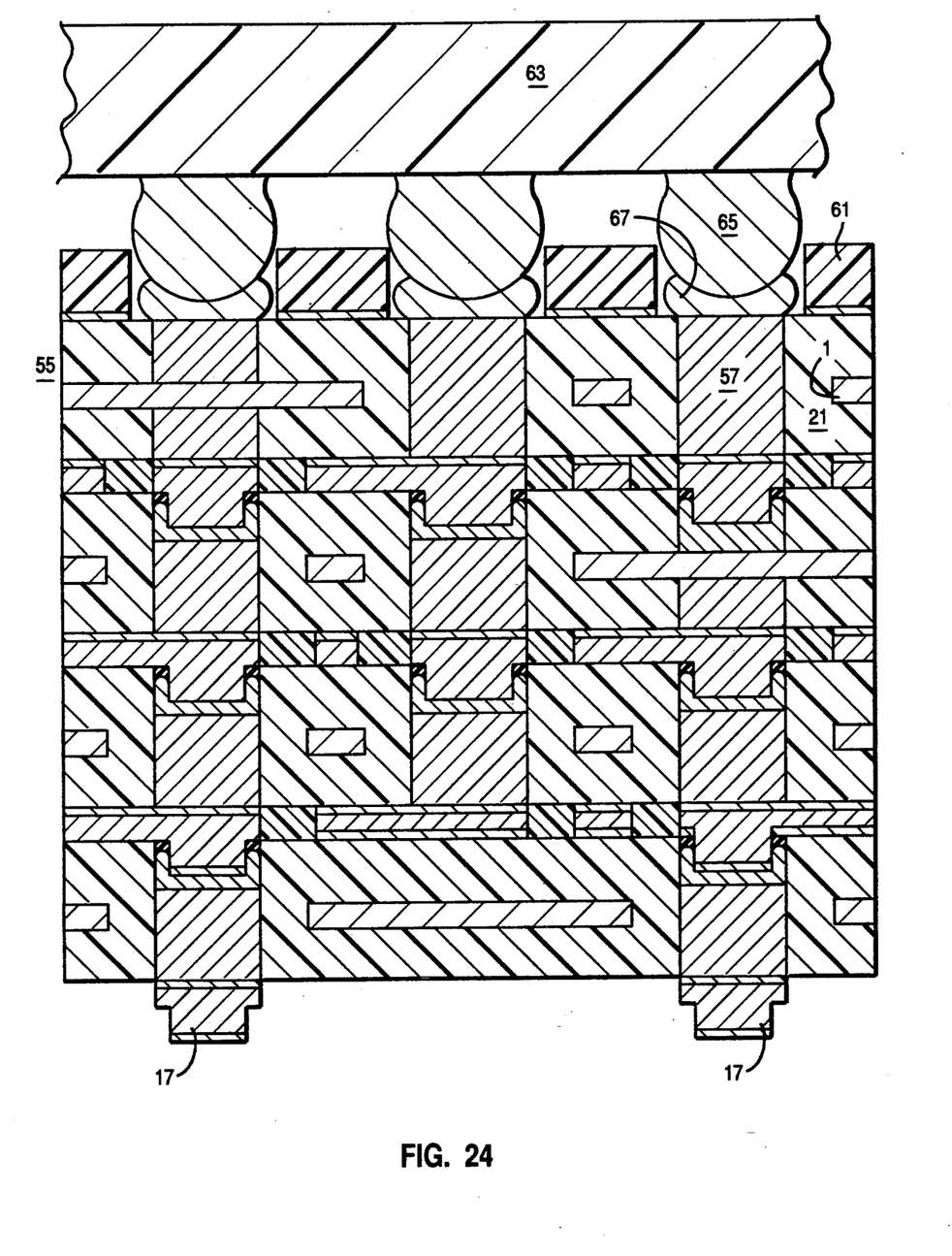
FIG. 24 is a multilayer carrier with an integrated circuit device disposed thereon.

FIG. 24 shows the 4S4P multilayer substrate of FIG. 23 with an integrated circuit device attached thereto. It can be seen why it may be desirable to extend cavity metallization 57 to the top surface of the multilayer substrate 55. Chip 63 includes solder balls 65 which must make electrical contact with studs 17 and 17a within substrate 55. Joining metallurgy is added to metallization 57 in order to create a connection pad and facilitate reflow of the solder ball 65 and the subsequent of chip 63 to multilayer substrate 55. Also shown is a positive stop layer 61 which allows integrated circuit device 63 to be pressed into place on multilayer substrate 55 with a greater amount of force then previously allowed. Positive stop 61 is described in previously mentioned co-pending U.S. patent application, filed concurrently herewith.

Figure 25:
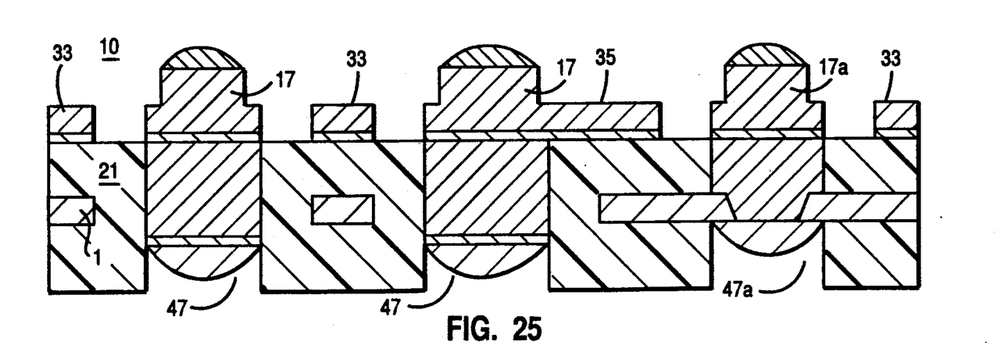
FIG. 25 is a crossectional view of another embodiment of the present invention.

FIG. 25 shows another embodiment of the present invention which utilizes different sizes of etched holes in metal foil 1 to fabricate groundplane vias and isolated vias. In order to fabricate isolated vias with studs 17 and cavities 47 a hole is required having a diameter which will allow dielectric material 21 to electrically isolate stud 17 from groundplane 1. Conversely, to form a groundplane via, a hole with a smaller diameter is formed in plane 1 such that contact between the electrically conductive material of stud 17a and groundplane 1 is achieved.

Although certain preferred embodiments have been shown and described, it should be understood that many changes and modifications may be made therein without departing from the scope of the appended claims.

What is claimed is:

1. A method of producing a high density one signal layer, one reference plane substrate for use in an electronic component, said method comprising the steps of:
    coating a first side of an etched metal foil layer with a first dielectric layer and forming a plurality of via holes in said metal foil layer;
    placing electrically conductive material within said via holes to form a plurality of studs;
    placing a signal layer on a surface of said first dielectric layer opposite said metal foil;
    forming projections by extending said studs outwardly past said signal layer in a direction away from said foil layer; and applying a second dielectric layer to a side of said foil opposite said first dielectric layer, and forming a plurality of cavities therein aligned with said studs.

2. A method according to claim 1 further comprising the steps of:
prior to coating the metal foil, etching clearance holes within the metal foil layer and filling said clearance holes with a dielectric material.

3. A method according to claim 2 further comprising the step of applying joining metallurgy material onto an exposed end of said projections and within said cavities.

4. A method according to claim 3 wherein said step of filling the clearance holes comprises the step of laminating a second metal foil layer to a side of the metal foil opposite said first side.

5. A method according to claim 4 wherein said step of forming a plurality of via holes, comprises the steps of,
forming a first set of said via holes, having a diameter less than said clearance holes and coaxial therewith, to create an annular portion of the dielectric material filled in said clearance holes; and
forming a second set of said via holes such that a portion of the reference plane layer is exposed.

6. A method according to claim 5 wherein the step of placing electrically conductive material comprises the steps of:
plating metal within the first set of said via holes, thereby forming vias electrically isolated from said reference plane layer by said annular portion of dielectric material, and
concurrently plating metal within the second set of said via holes, thereby forming vias in electrical communication with said reference plane layer.

7. A method according to claim 6 wherein said step of placing said signal layer comprises the steps of:
depositing a metal layer, adjacent said vias, on a surface of said first dielectric material opposite said metal foil;
applying a first layer of photoresist material adjacent said metal layer and a second photoresist layer on a side of said second metal foil layer opposite said first metal foil layer;
forming a set of openings in said first photoresist layer;
plating electrically conductive material into said openings, thereby forming electric signal lines included within said signal layer; and
removing said first layer of photoresist.

8. A method according to claim 7 wherein said step of forming projections comprises the steps of:
applying a third layer of photoresist material adjacent said metal layer;
forming a set of openings in said third photoresist layer, aligned with said studs;
plating electrically conductive material in said openings, thereby extending said studs in a direction opposite said first metal foil; and
removing said second and third layers of photoresist material.

9. A method according to claim 8 wherein said step of forming a plurality of cavities comprises the step of forming said cavities coaxial with said studs and opposite said projections, thereby exposing an end of said isolated vias and a portion of said first metal foil, directly opposite sad reference plane vias.

10. A method according to claim 9 wherein said step of applying joining metallurgy comprises the step of reflowing said joining metallurgy to create convex configurations thereof.

11. A method according to claim 10 further comprising the step of removing remaining exposed portions of said metal layer deposited during the step of depositing a metal layer.

12. A method according to claim 3 wherein said step of applying joining metallurgy comprises electroplating said metallurgy onto the exposed end of said projections and within said cavities.

13. A method of producing a multilayer substrate having a plurality of individual one signal, one reference plane substrates, said method comprising the steps of:
providing a plurality of said individual substrates, each having a first surface with a plurality of electrical interconnection cavities and a second surface with a corresponding plurality of electrical interconnection projections;
applying a layer of joining material to said first surface of said individual substrates;
depositing joining metallurgy within said cavities and on an exposed end of said projection; and
stacking said individual substrates, such that said plurality of projections of a first individual substrate are in vertical alignment with said plurality of cavities in an adjacent individual substrate, said step of stacking including compressing said stacked individual substrates, laminating said individual layers, reflowing said joining metallurgy and curing said joining material.

14. A method according to claim 13 wherein said joining material is a thermoset or a thermoplastic material.

15. A method according to claim 13 wherein said step of applying a layer of joining material comprises the step of applying said joining material to said second surface of said individual substrates.

16. A method according to claim 13 wherein said step of applying a layer of joining material comprises the steps of:
applying joining material to said first surface of said individual substrates; and
applying joining material to said second surface of said individual substrates.

17. A method according to claim 13 wherein said step of depositing joining metallurgy comprises electroplating said joining metallurgy on the exposed end of said projections and within said cavities.

* * * * *